(12) United States Patent
Nakagawa et al.

(10) Patent No.: US 8,716,869 B2
(45) Date of Patent: May 6, 2014

(54) CELL ARRAY AND DENSITY FEATURES WITH DECOUPLING CAPACITORS

(75) Inventors: Osamu S. Nakagawa, Redwood City, CA (US); Moshtaque Yusuf, Cupertino, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 203 days.

(21) Appl. No.: 13/359,107

(22) Filed: Jan. 26, 2012

(65) Prior Publication Data

US 2013/0193554 A1 Aug. 1, 2013

(51) Int. Cl.
*G06F 17/50* (2006.01)

(52) U.S. Cl.
USPC .......................................... 257/773; 716/118

(58) Field of Classification Search
USPC ................... 257/532, 773; 438/758; 716/118
See application file for complete search history.

(56) References Cited

U.S. PATENT DOCUMENTS

| | | | |
|---|---|---|---|
| 7,574,685 B1 * | 8/2009 | Dong et al. | 716/118 |
| 2011/0049721 A1 * | 3/2011 | Koti et al. | 257/773 |
| 2013/0183832 A1 * | 7/2013 | Landis | 438/758 |

\* cited by examiner

*Primary Examiner* — Thomas L Dickey
(74) *Attorney, Agent, or Firm* — Amerson Law Firm, PLLC

(57) ABSTRACT

A method includes defining an array including a plurality of unit cells, receiving unit cell density parameters in a computing apparatus, and defining a plurality of sub-arrays of unit cells using the computing apparatus. The computing apparatus defines density features disposed between adjacent sub-arrays. The computing apparatus generates density feature density parameters based on the unit cell density parameters and at least one density limit.

10 Claims, 3 Drawing Sheets

CELL ARRAY AND DENSITY FEATURES WITH DECOUPLING CAPACITORS

CROSS-REFERENCE TO RELATED APPLICATIONS

Not applicable.

STATEMENT REGARDING FEDERALLY SPONSORED RESEARCH OR DEVELOPMENT

Not applicable

BACKGROUND

The disclosed subject matter relates generally to semiconductor device manufacturing and, more particularly, to a cell array with density features and a method for instantiating the cell array.

Integrated circuit devices are typically designed using a combination of automated design techniques and manual design techniques. One type of structure commonly designed using an automated design technique is a parameterized cell (pcell). Parameterized cells are generally laid out using an array structure, as illustrated in FIG. 1. An array 100 includes a plurality of unit cells 110 grouped into sub-arrays 120, each having n×m unit cells 110. Sub-arrays 120 are then replicated in a row 130 and column 140 arrangement. The total number of unit cells 110 in the array 100 is i×j. In some structures, certain parameters of each cell 110, such as resistance, structure length, structure width, etc. may vary across the array 100, while in others, the cell parameters may be fixed.

Conventionally, unit cells are instantiated into closely-packed sub-arrays and arrays to minimize overall array size. In such designs, a component in a certain design layer of a unit cell can exclude other components in different design layers from being placed in its proximity. One example is a poly-silicon (PC) shape in a poly-resistor (PR) cell that excludes diffusion (RX). This restriction can consistently block components in a certain design layer and create a continuous keep-out zone for the design layer throughout the array. This arrangement may result in yield loss, because stringent layout pattern uniformity is required for several key design layers. The large keep-out zone can result in a violation of the pattern uniformity requirement. In the example of a poly resistor array, a large void of diffusion in the array can cause a diffusion minimum density rule violation. On the other side of the density rule spectrum, a unit cell with a design component that occupies a large fraction of the cell area can result in a maximum density rule violation when instantiated as an array.

Many times designers only find these maximum and minimum density rule violations at a very late stage in the design cycle when pattern uniformity is checked by a design rule checker (DRC). The need to rearrange the cell arrays to address a density issue at such a late stage is a frequent reason for a delay in completing a design.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes defining an array including a plurality of unit cells, receiving unit cell density parameters in a computing apparatus, and defining a plurality of sub-arrays of unit cells using the computing apparatus. The computing apparatus defines density features disposed between adjacent sub-arrays. The computing apparatus generates density feature density parameters based on the unit cell density parameters and at least one density limit.

Another aspect of the disclosed subject matter is seen a semiconductor device including an array of cells. The array includes a plurality of sub-arrays of the cells and density features disposed between adjacent sub-arrays.

Yet another aspect of the disclosed subject matter is seen in a system including a computing apparatus operable to define an array including a plurality of unit cells, receive unit cell density parameters, define a plurality of sub-arrays of unit cells, and define density features disposed between adjacent sub-arrays. The density feature density parameters for the density features are generated based on the unit cell density parameters and at least one density limit.

BRIEF DESCRIPTION OF THE SEVERAL VIEWS OF THE DRAWINGS

The disclosed subject matter will hereafter be described with reference to the accompanying drawings, wherein like reference numerals denote like elements, and.

DETAILED DESCRIPTION

Figure 1:
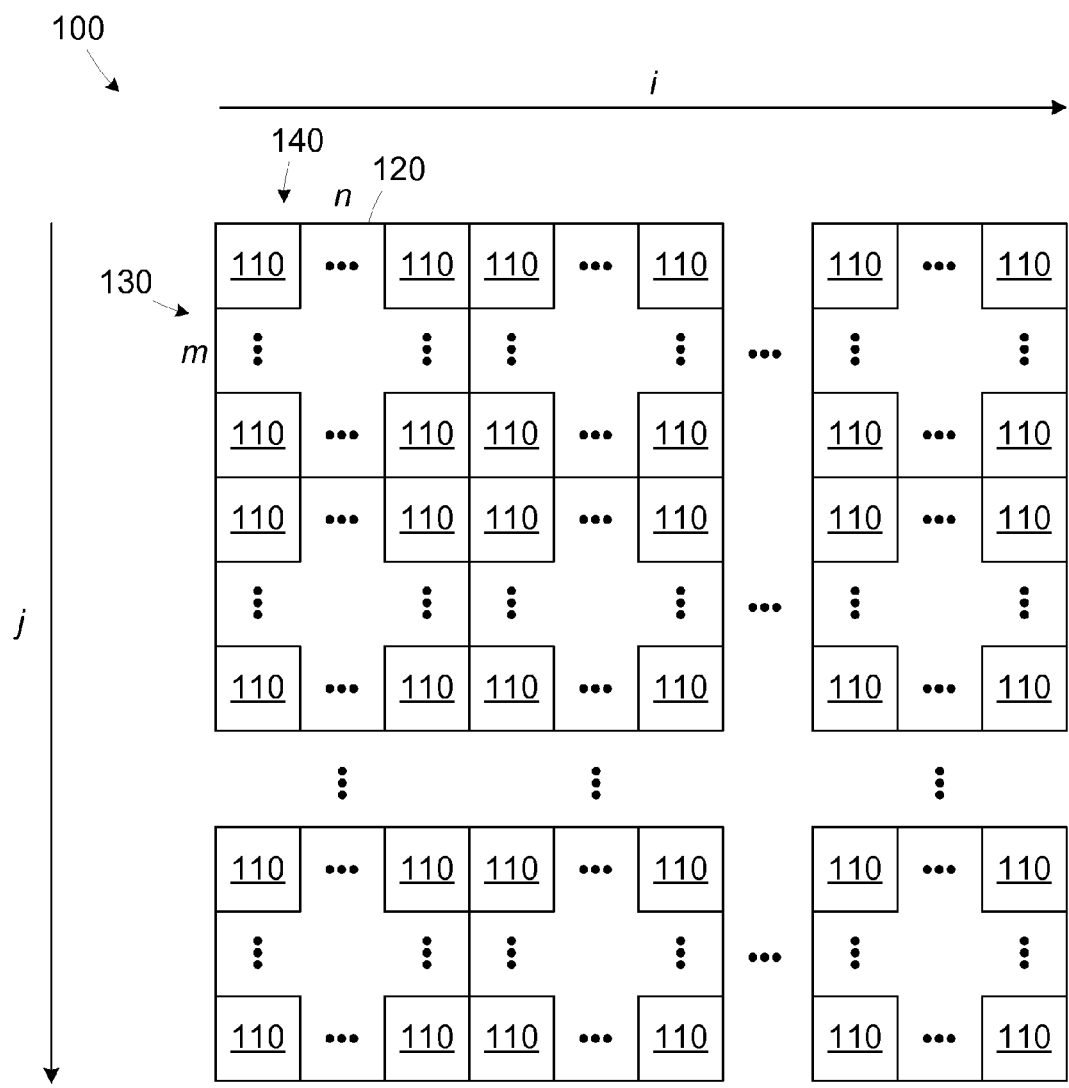
FIG. 1 is a simplified diagram of a conventional array of cells.

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 2:
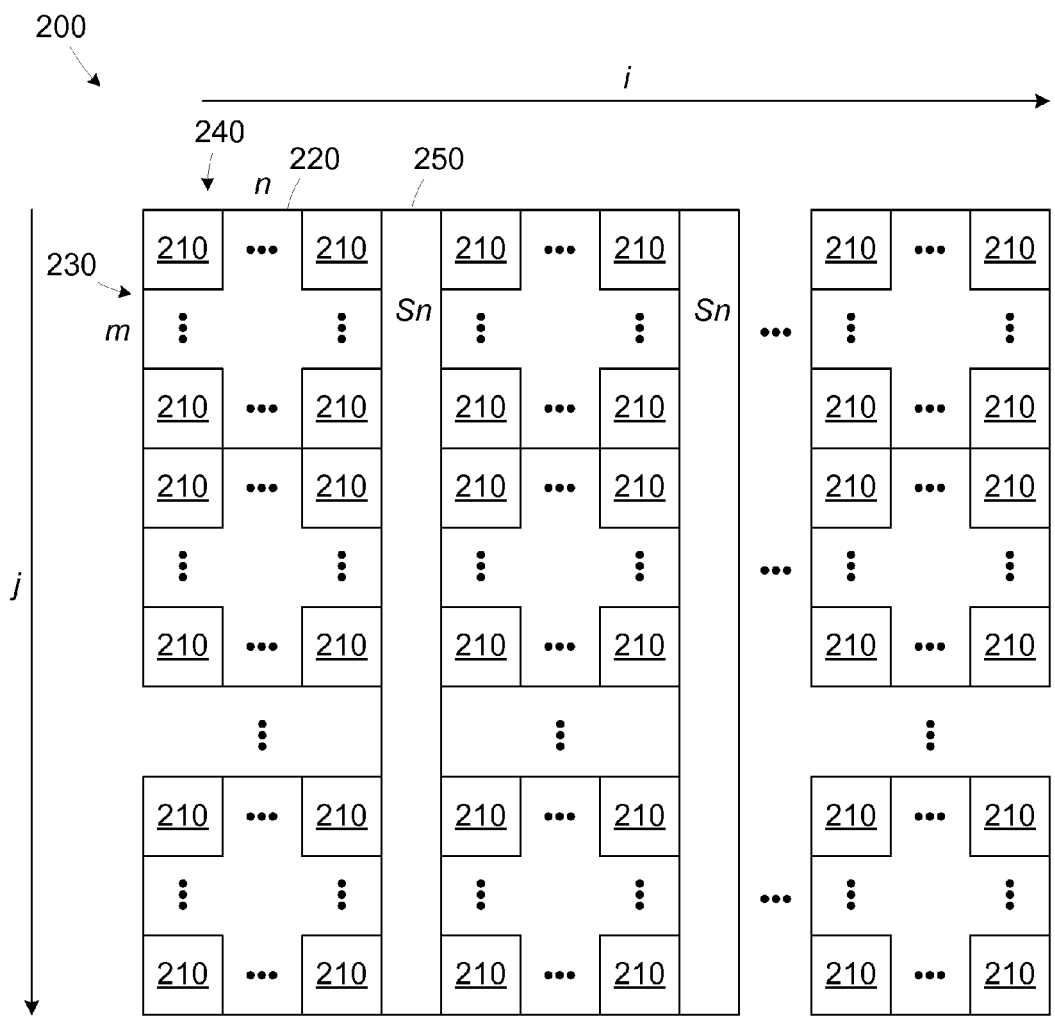
FIG. 2 is a simplified diagram of an array of cells including density features disposed between sub-arrays of the cells in accordance with an illustrative embodiment of the present subject matter.

Referring now to the drawings wherein like reference numbers correspond to similar components throughout the several views and, specifically, referring to FIG. 2, the disclosed subject matter shall be described in the context of an array 200 including a plurality of unit cells 210 grouped into sub-arrays 220, each having n×m unit cells 110. Sub-arrays 220 are replicated in a row 230 and column 240 arrangement. The total number of unit cells 210 in the array 200 is i×j. A density feature 250 is provided between columns 240 of the array 200.

The present example is described as it may be applied to an array 200 of parameterized cells (pcells), however, the application of the present subject matter is not limited to pcells, and other types of unit cells 210, such as memory cells, may be employed. With respect to the pcell example, in some embodiments, certain parameters of each cell 210, such as resistance, structure length, structure width, etc. may vary across the array 200, while in others, the cell parameters may be fixed. One exemplary array type includes an array of bipolar devices having diffusion regions, without polysilicon features. Another exemplary array type is an array of large decoupling capacitors (decaps) including polysilicon features and diffusion regions.

In general, the density features 250 are provided to affect the pattern density of the array 200. The density features 250 may represent an unoccupied region of the semiconductor device to decrease the net pattern density, or the density feature 250 may include features, such as polysilicon features or resistor elements, etc.

Figure 3:
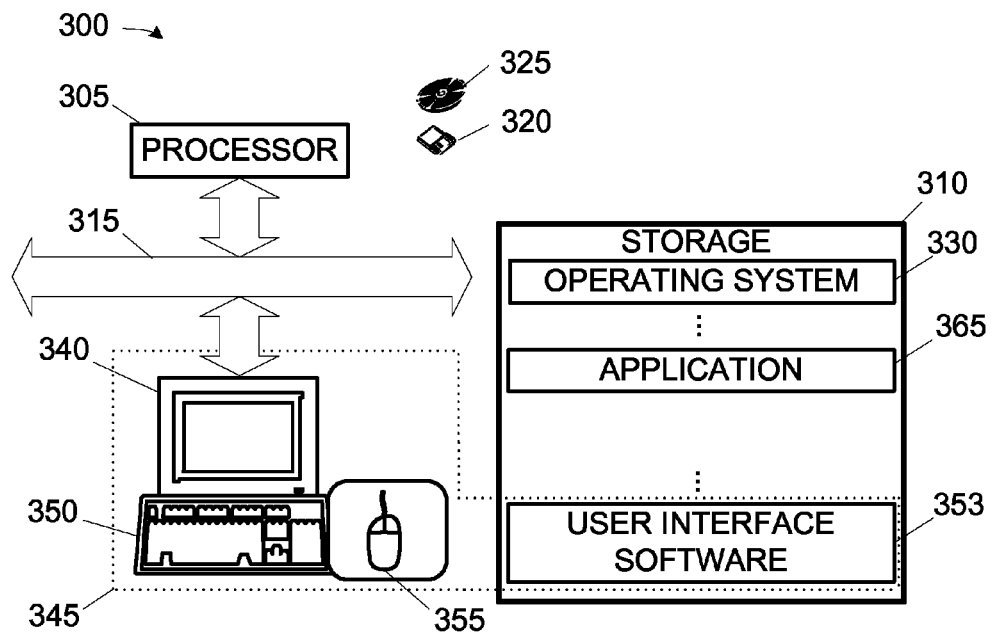
FIG. 3 is a simplified block diagram of a computing system adapted to perform a method for instantiating the array of FIG. 2.

Turning now to FIG. 3, a simplified diagram of a computing apparatus 300 for determining density requirements for semiconductor devices is provided. The computing apparatus 300 includes a processor 305 communicating with storage 310 over a bus system 315. The storage 310 may include a hard disk and/or random access memory ("RAM") and/or removable storage, such as a magnetic disk 320 or an optical disk 325. The storage 310 is also encoded with an operating system 330, user interface software 335, and a density application 365. The user interface software 335, in conjunction with a display 340, implements a user interface 345. The user interface 345 may include peripheral I/O devices such as a keypad or keyboard 350, mouse 355, etc. The processor 305 runs under the control of the operating system 330, which may be practically any operating system known in the art. The density application 365 is invoked by the operating system 330 upon power up, reset, user interaction, etc., depending on the implementation of the operating system 330. The application 365, when invoked, performs a method of the present subject matter. The user may invoke the density application 365 in conventional fashion through the user interface 345. Note that although a stand-alone system is illustrated, there is no need for the data to reside on the same computing apparatus 300 as the density application 365 by which it is processed. Some embodiments of the present subject matter may therefore be implemented on a distributed computing system with distributed storage and/or processing capabilities.

It is contemplated that, in some embodiments, the density application 365 may be executed by the computing apparatus 300 to implement one or more of the techniques described herein. Data for the density application 365 may be stored on a computer readable storage device (e.g., storage 310, disks 320, 325, solid state storage, and the like).

In the illustrated embodiment, the density application 365 employs a linear mixed-integer programming model for determining density parameters for the array 200, such as the spacing, Sn, defined by the density features 250 and the density, Dn, of any non-functional shapes included in the density features 250. In such an optimization based approach, solutions are driven by a plurality of objectives. Constraints are defined that serve as conditions to narrow down the solution scope. With a commercially or publicly available solver, a linear (i.e., either integer or non-integer) solution can be identified within the solution scope. For example, the OSL solver offered by IBM, Corporation is a commercially available software tool that may be used. For purposes of the following description, the following notation list provided in Table 1 identifies symbols used in the following objective and constraint equations.

TABLE 1

Notation

For a Unit Cell, U, implemented in a design layer, L
Unit Cell Density Input Parameters

| | |
|---|---|
| Wx | Width of U in the x-direction |
| Wy | Width of U in the y-direction |
| Dn | Pattern Density of L inside U |
| | Density Limits |
| Smin | Minimum space defined by a design rule between a shape in L outside of U and U itself |
| Dmin | Minimum density value allowed by design rule for L |
| Dmax | Maximum density value allowed by design rule for L |

Output Density Parameters of Density Features and Sub-Arrays

| | |
|---|---|
| Sn | Width of a density feature 250 to be inserted between adjacent unit cells, U for sparsification |
| Ds | Pattern Density of L inside density feature 250 |
| M | Number of U in x-direction across array |
| N | Number of U in y-direction across array |

The density application 365 employs an optimization equation:

$$\text{Maximize } \frac{1}{(Sn + Wx \cdot n) \cdot (Wy \cdot m)}$$

where the denominator of the optimization equation represents an area of a sub-array 220 and the associated density feature 250. Maximizing the reciprocal of the area effectively minimizes the area.

The optimization is performed subject to density constraints.

$$\frac{Ds \cdot Sn + Dn \cdot Wx \cdot n}{Sn + Wx \cdot n} \geq D\min$$

$$\frac{Ds \cdot Sn + Dn \cdot Wx \cdot n}{Sn + Wx \cdot n} \leq D\max$$

The term $Ds \cdot Sn \cdot (Wy \cdot m)$ represents the area of shapes within the density feature 250. The term $Dn \cdot Wx \cdot n \cdot (Wy \cdot m)$ represents the area of shapes within the sub-array 220. The term $(Sn + Wx \cdot n) \cdot (Wy \cdot m)$ represents the overall area. In the density constraints, the $(Wy \cdot m)$ term cancels.

The density of the density feature 250 is a value determined from the design rules and the determined spacing.

$$Ds = \frac{Sn - 2 \cdot S\min}{Sn}$$

The overall size of the array 200, determined by i and j provides an additional constraint the impacts the optimal value of m, n, and Sn.

In one embodiment, a designer may provide the size of the array 200 to the density application 365 along with the size and density characteristics of the cells 210 and the design rule values. The density application 365 evaluates the objective function and constraints to generate values for m, n, and Sn.

In another embodiment, the density application 365 uses the density parameters of the cells 210 and the design rule values and iterates the optimization for different array sizes, i.e., different values for i and j to generate a look-up table 370. A designer can then input the size of the array 200 and receive the values for m, n, and Sn. If the look-up table 370 does not include the desired array size, the density application 365 may be invoked to generate the appropriate values for the specified array size.

The optimization function is illustrated as it may be implemented for one layer, however, it is contemplated that the input values and/or constraints may have layer subscripts, and may have different values for different layers. The optimization could then be used to generate a solution that spans a plurality of layers. In such an implementation, the density features 250 can be composite cells that include multiple, different shapes in multiple layers.

Figure 4:
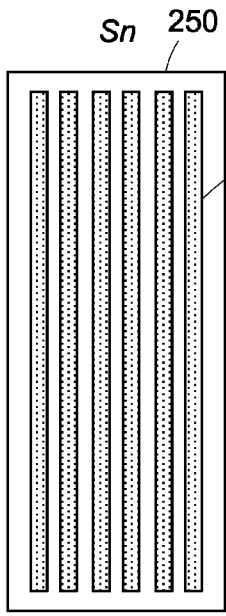
FIG. 4 depicts an array including non-functional lines
Figure 5:
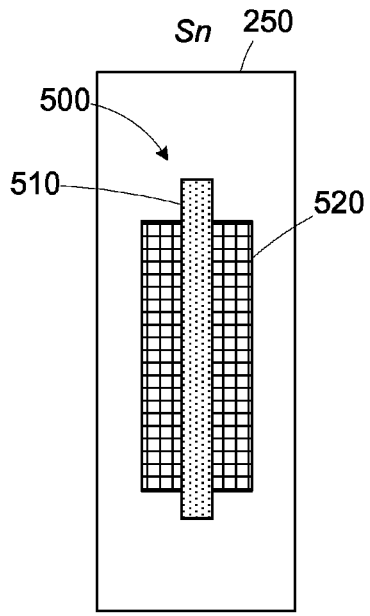
FIG. 5 depicts a density application including non-functional decoupling capacitors
Figure 6:
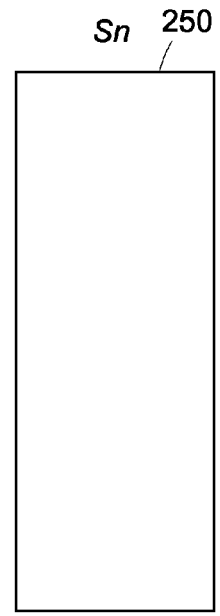
FIG. 6 depicts a density structure devoid of additional features While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

Based on the determined values for Sn and Dn, the density application automatically generates shapes in the density features 250 to provide the required density characteristics. For example, in an array 200 including bipolar device unit cells, non-functional lines 400 may be defined, as illustrated in FIG. 4. The lines may be polysilicon to add both minimum polysilicon density and minimum perimeter polysilicon density. In another example, for an array 200 of decoupling capacitors, without adjustment, the array might violate maximum polysilicon density and diffusion region density, while also violating minimum perimeter polysilicon density. The density application 365 can reduce the polysilicon and diffusion region densities and increase the perimeter polysilicon density to satisfy the design rules. The density application 365 may add non-functional decoupling capacitors 500, defined by the intersection of a line 510 and a diffusion region 520. If the maximum diffusion region density is reached, the diffusion regions 520 may be omitted. In still other examples, where the unadjusted array 200 would violate maximum density rules, the density feature 250 could be devoid of any features, as illustrated in FIG. 6.

Although the examples provided above address density in one direction by adding vertical density features 250 between adjacent sub-arrays 220, it is contemplated that the techniques described herein may be adapted for use with both horizontal and vertical density features 250 to address density in both directions of the array. Such a two-dimensional approach would consider overlap between horizontal and vertical density features 250 and their contributions to the overall density.

In some embodiments, the density application 365 may instantiate the array 200 based on the determined density attributes. Predetermined, non-functional shapes may be added in the density feature 250. The density application may use different kinds of hardware descriptive languages (HDL) in the process of designing and manufacturing very large scale integration circuits (VLSI circuits), such as semiconductor products and devices and/or other types semiconductor devices including the array 200. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., storage 310, disks 320, 325, solid state storage, and the like). In one embodiment, the GDSII data (or other similar data) may be adapted to configure a manufacturing facility (e.g., through the use of mask works) to create devices capable of embodying various aspects of the present subject matter. In other words, in various embodiments, this GDSII data (or other similar data) may be programmed into the computing apparatus 300, and executed by the processor 305 using the density application 365, which may then control, in whole or part, the operation of a semiconductor manufacturing facility (or fab) to create semiconductor products and devices. For example, in one embodiment, silicon wafers containing the power array 200 may be created using the GDSII data (or other similar data).

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
    defining an array including a plurality of unit cells;
    receiving unit cell density parameters in a computing apparatus;
    defining a plurality of sub-arrays of unit cells using the computing apparatus;
    defining density features disposed between adjacent sub-arrays using the computing apparatus, wherein the computing apparatus generates density feature density parameters based on the unit cell density parameters and at least one density limit and wherein the computing apparatus defines shapes in the density features based on the density feature density parameters, wherein the shapes comprise decoupling capacitors; and
    manufacturing an apparatus comprising the sub-arrays, the density features and the decoupling capacitors.

2. The method of claim 1, wherein the computing apparatus solves an objective function for an area of the array subject to at least one constraint defined by the at least one density limit, the unit cell density parameters, and the density feature density parameter to generate the at least one density parameter of the density features.

3. The method of claim 2, wherein the computing apparatus solves the objective function to determine a number of unit cells in each sub-array.

4. The method of claim 3, wherein the unit cell density parameters include a unit cell width, the density feature density parameters include a density feature width, and the objective function defines the area of the array based on the density feature width, the unit cell width, and the number of unit cells in each sub-array.

5. The method of claim 4, wherein the unit cell density parameters include a unit cell pattern density, the density feature density parameters include an density feature pattern density, and the at least one constraint compares the density limit to an array density defined by the density feature pattern density multiplied by the density feature width plus the unit cell pattern density multiplied by the unit cell width and the number of unit cells in each sub-array.

6. The method of claim 2, wherein the at least one constraint comprises a first constraint based on a maximum density of the array and a second constraint based on a minimum density of the array.

7. The method of claim 2, wherein the density feature density parameters comprise a density feature width and a density feature pattern density.

8. The method of claim 1, wherein the computing apparatus is operable to repeat the defining of the plurality of sub-arrays and the defining of the density features for a plurality of array sizes and generate a look-up table including the density feature density parameters for each of the array sizes.

9. A semiconductor device, comprising:
    an array of cells, wherein the array comprises:
    a plurality of sub-arrays of the cells; and
    density features disposed between adjacent sub-arrays, wherein the density features comprise decoupling capacitors.

10. A computer readable storage device encoded with data that, when implemented in a manufacturing facility, adapts the manufacturing facility to create an apparatus, comprising:
    an array of cells, wherein the array comprises:
    a plurality of sub-arrays of the cells; and
    density features disposed between adjacent sub-arrays, wherein the density features comprise decoupling capacitors.

* * * * *